(12) United States Patent
Matamis et al.

(10) Patent No.: US 8,946,803 B2
(45) Date of Patent: Feb. 3, 2015

(54) METHOD OF FORMING A FLOATING GATE WITH A WIDE BASE AND A NARROW STEM

(75) Inventors: George Matamis, San Jose, CA (US); Henry Chien, San Jose, CA (US); Vinod Robert Purayath, Santa Clara, CA (US); Takashi Whitney Orimoto, Sunnyvale, CA (US); James Kai, Santa Clara, CA (US)

(73) Assignee: SanDisk Technologies Inc., Plano, TX (US)

( * ) Notice: Subject to any disclaimer, the term of this patent is extended or adjusted under 35 U.S.C. 154(b) by 580 days.

(21) Appl. No.: 11/951,998

(22) Filed: Dec. 6, 2007

(65) Prior Publication Data

US 2009/0147576 A1   Jun. 11, 2009

(51) Int. Cl.
| H01L 29/788 | (2006.01) |
|---|---|
| H01L 21/28 | (2006.01) |
| H01L 27/115 | (2006.01) |
| H01L 27/108 | (2006.01) |
| H01L 29/423 | (2006.01) |

(52) U.S. Cl.
CPC .... *H01L 21/28273* (2013.01); *H01L 27/11524* (2013.01); *H01L 27/10844* (2013.01); *H01L 27/115* (2013.01); *H01L 27/11519* (2013.01); *H01L 27/11521* (2013.01); *H01L 29/42324* (2013.01); *H01L 29/7881* (2013.01)
USPC ........................................................ 257/315

(58) Field of Classification Search
CPC ............... H01L 27/11519; H01L 27/0207; H01L 27/1052; H01L 27/11517; H01L 27/1156; H01L 27/115; H01L 27/11524; H01L 27/10844

USPC ............ 365/185.17; 257/202, 228, 314, 365, 257/315, 908, E27.004, E27.009–E27.113, 257/E27.001, 185.17; 438/128, 129, 130, 438/279, 257, 587, 588
See application file for complete search history.

(56) References Cited

U.S. PATENT DOCUMENTS

| 5,798,279 | A  * | 8/1998  | Crisenza et al. ............... 438/201 |
|---|---|---|---|
| 5,869,360 | A  * | 2/1999  | Batra et al. ..................... 438/151 |
| 7,064,379 | B2 * | 6/2006  | Kutsukake et al. ........... 257/315 |
| 7,303,956 | B2 * | 12/2007 | Harari ............................ 438/257 |
| 7,374,995 | B2 * | 5/2008  | Kutsukake et al. ........... 438/257 |
| 7,586,786 | B2 * | 9/2009  | Matsunaga et al. ....... 365/185.17 |
| 2005/0023597 | A1 * | 2/2005  | Kutsukake et al. ........... 257/315 |
| 2006/0060911 | A1 * | 3/2006  | Sakuma et al. ................ 257/315 |
| 2007/0111441 | A1 * | 5/2007  | Koh et al. ...................... 438/257 |
| 2007/0243680 | A1 * | 10/2007 | Harari et al. .................. 438/257 |
| 2009/0162977 | A1 * | 6/2009  | Purayath et al. .............. 438/128 |
| 2009/0163008 | A1 * | 6/2009  | Purayath et al. .............. 438/586 |
| 2010/0214840 | A1 * | 8/2010  | Ichikawa et al. ......... 365/185.17 |

* cited by examiner

*Primary Examiner* — Phat X Cao
*Assistant Examiner* — Diana C Vieira
(74) *Attorney, Agent, or Firm* — Vierra Magen Marcus LLP (57) ABSTRACT

Floating gates of a floating gate memory array have an inverted-T shape in both the bit line direction and the word line direction. Floating gates are formed using an etch stop layer that separates two polysilicon layers that form floating gates. Word lines extend over floating gates in one example, and word lines extend between floating gates in another example.

9 Claims, 7 Drawing Sheets

METHOD OF FORMING A FLOATING GATE WITH A WIDE BASE AND A NARROW STEM

BACKGROUND OF THE INVENTION

This invention relates to nonvolatile memories and methods of forming nonvolatile memories. In particular, this application relates to nonvolatile memory arrays in which floating gates are shaped to have an inverted-T shape in cross section, and to methods of forming such memory arrays.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Different types of memory array architecture are used in nonvolatile memory systems. In one type of architecture, a NAND array, a series of strings of more than two memory cells, such as 16 or 32, are connected along with one or more select transistors between individual bit lines and a reference potential to form columns of cells. Word lines extend across cells within a large number of these columns.

SUMMARY OF THE INVENTION

A nonvolatile memory array includes floating gates that have an inverted-T shape in cross section along both the word line direction and the bit line direction. Thus, floating gates have relatively wide bases, giving good coupling to the underlying channel and reducing or eliminating short channel effects. Floating gates have relatively narrow stems, allowing extra space for control gates and interlayer dielectric between floating gates, while providing a large surface area for coupling between floating gates and word lines. Memory arrays with such inverted-T shaped floating gates may be formed using an etch stop layer between a base polysilicon layer and a stem polysilicon layer. Etching the stem (in both directions) stops on the etch stop layer so that floating gates are made in a repeatable manner.

A nonvolatile memory array according to an embodiment of the present invention comprises: a plurality of conductive floating gates on a surface of a semiconductor substrate, each of the plurality of floating gates having a base portion and a stem portion that extends upwards from the base portion, each of the plurality of floating gates having an inverted-T shape in cross-section along a word line direction, each of the plurality of floating gates also having an inverted-T shape in cross section along a bit line direction, the bit line direction being perpendicular to the word line direction.

A nonvolatile memory array according to an embodiment of the present invention comprises: a plurality of memory cells connected together in series along a bit line direction to form a NAND string, each of the plurality of memory cells having a floating gate that overlies a channel region; a plurality of word lines extending in a word line direction that is perpendicular to the bit line direction, an individual one of the plurality of word lines coupling to at least one floating gate of the NAND string; and each floating gate of the plurality of memory cells having a base portion and a stem portion that extends upwards from the base portion, the base portion having a first dimension along the bit line direction, the stem portion having a second dimension along the bit line direction that is smaller than the first dimension, each base portion having a third dimension along the word line direction, the stem portion having a fourth dimension along the word line direction that is smaller than the third dimension.

A method of forming a floating gate memory array according to an embodiment of the present invention comprises: forming a gate dielectric layer over a substrate surface; forming a first conductive floating gate layer over the gate dielectric layer; forming an etch stop layer over the first conductive floating gate layer; forming a second conductive floating gate layer over the etch stop layer; forming upper portions of floating gates by etching down through the second conductive floating gate layer, to the etch stop layer, according to a first pattern; and forming lower portions of floating gates by etching down through the first conductive floating gate layer, to the gate dielectric layer, using a second pattern, the lower portions thus formed having larger dimensions than the upper portions in both a bit line direction and a word line direction.

A method of forming a floating gate memory array having a base portion and a stem portion according to an embodiment of the present invention comprises: forming a gate dielectric layer on a substrate; forming a first conductive floating gate layer that overlies the gate dielectric layer; forming an etch stop layer that overlies the first conductive floating gate layer; forming a second conductive floating gate layer that overlies the etch stop layer; etching the second conductive floating gate layer down to the etch stop layer, leaving second conductive floating gate portions with a first dimension along the word line direction; etching the first conductive floating gate layer down to the gate dielectric layer leaving first conductive floating gate portions with a second dimension along the word line direction, the second dimension being greater than the first dimension; etching the second conductive floating gate portions down to the etch stop layer, leaving stems with a third dimension along the bit line direction, the third dimension being greater than the first dimension; and etching the first conductive floating gate portions down to the gate dielectric to leave bases with a fourth dimension along the bit line direction, the fourth dimension being greater than the second dimension.

DETAILED DESCRIPTION OF ILLUSTRATED EMBODIMENTS

Figure 1:
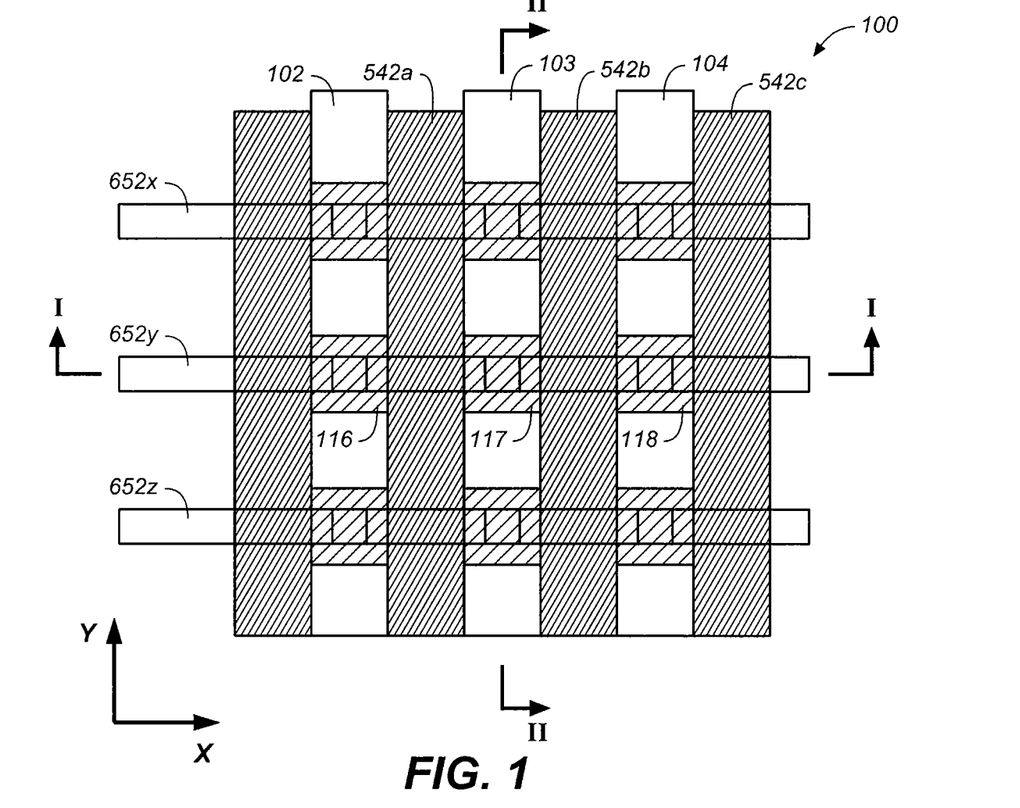
FIG. 1 shows a plan view of a portion of an exemplary NAND flash memory array according to an embodiment of the present invention, with word lines extending over floating gates.

FIG. 1 shows a portion of an exemplary NAND flash memory array 100 according to an embodiment of the present invention. A small part of the repetitive structure of the NAND array is shown in plan view in FIG. 1, with just three memory cells shown in each of three NAND strings 102-104. NAND strings 102-104 are shown extending in the y-direction. Shallow Trench Isolation (STI) regions 542a-c are shown extending between strings 102-104 to isolate cells of adjacent strings from each other. Bit lines (not shown) extend in the y-direction to connect NAND strings along a column with read/write circuits. The y-direction may also be referred to as the bit line direction. Word lines 652x-z are shown extending at right angles to the NAND strings 102-104 in the x-direction (also referred to as the word line direction). Word lines 652x-z in the present example overlie floating gates along a row and couple to these floating gates through an interlayer dielectric. For example, word line 652y overlies floating gates 116-118. Where word lines couple to floating gates in this way, they form control gates of the memory cells along the row. Cells along a row are connected together in series by conductive source/drain regions. FIG. 1 indicates a first cross section (I-I) along a row of cells, in this case along word line 113, and a second cross section (II-II) along NAND string 103. Subsequent figures show cross sectional views along I-I and II-II during formation to illustrate the steps used to form the memory array.

Figure 2:
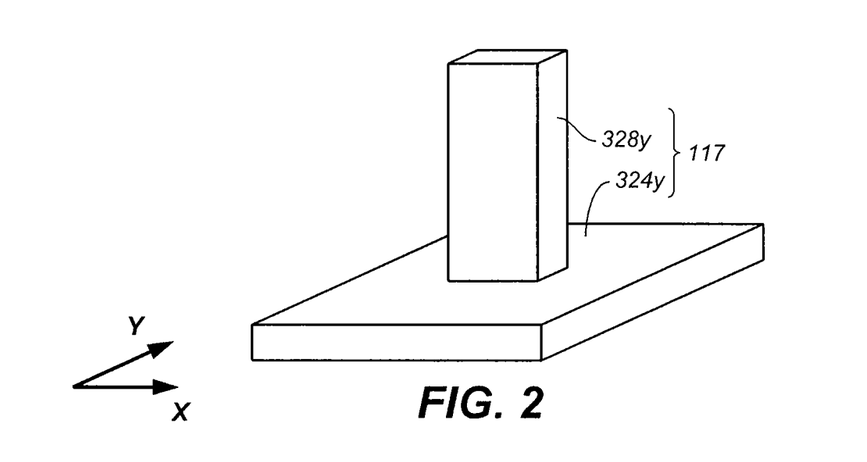
FIG. 2 shows an individual floating gate of FIG. 1 that has an inverted-T shape in both the bit line and the word line direction.

FIG. 2 shows a more detailed, three-dimensional view of an individual floating gate 117 of FIG. 1. In particular, FIG. 2 shows that floating gate 117 is made up of a base portion (lower portion) 324y and a stem portion (upper portion) 328y that extends upwards from base portion 324y. Base portion 324y extends over a channel region in NAND string 103, with a gate dielectric layer separating the base portion from the channel. Thus, floating gate 117 couples to the channel according to the area of base portion 324y. By maintaining a relatively large base portion (compared with the stem portion) a high degree of coupling to the underlying channel is achieved. Also, short channel effects, which may occur where a floating gate's dimension along the y-direction is reduced, are kept to an acceptable level. The stem 328y extends from the base 324y and provides surface area for coupling floating gate 117 to word line 652y. The stem portion 328x is smaller in both the x-direction and y-direction than the base portion 324y so that the floating gate 117 forms an inverted-T shape in both the x-direction and the y-direction. The reduced dimensions of stem portions, such as stem portion 328y, reduces coupling between neighboring floating gates because of the increased separation between such floating gates. Also, the reduced dimension of the stem portion 328y in the x-direction provides additional space between stem portions for the word line and dielectric, which facilitates scaling to smaller dimensions as will be shown later. It should be noted that FIG. 2 (and all other figures of the present application) is not intended to show the actual scale of the features depicted.

Figure 3:
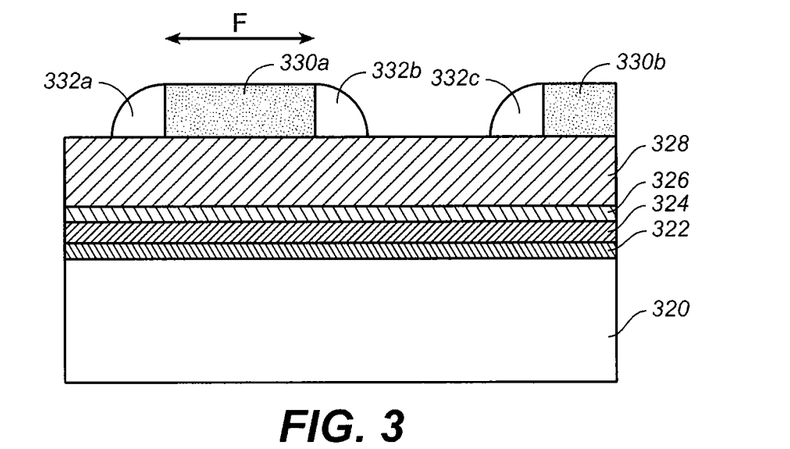
FIG. 3 shows a cross sectional view of the NAND flash memory array of FIG. 1 at an intermediate stage of fabrication, including a base polysilicon layer, an etch stop layer and a stem polysilicon layer.

FIG. 3 shows a cross sectional view along I-I at an intermediate stage of fabrication. FIG. 3 shows a substrate 320 (Silicon substrate with appropriate doping) having a gate dielectric layer 322 on its top surface. The gate dielectric layer 322 is a gate oxide in this example (thin layer of grown oxide) though other dielectric materials may also be used. A base polysilicon layer 324 (from which the base portions of floating gates are later formed) overlies gate dielectric layer 322. An etch stop layer 326 overlies base polysilicon layer 324. The etch stop layer 326 is a layer of a suitable material that allows an etch to remove polysilicon and stop at this layer, i.e. it is a material for which an etch provides a high selectivity to polysilicon over the etch stop material. Example of such a material include Silicon Nitride (SiN); Silicon dioxide ($SiO_2$), which may be formed by Chemical Vapor Deposition (CVD) e.g. using TEOS, or may be formed by growing Thermal Oxide; Alumina ($Al_2O_3$); Tantalum (Ta); Tantalum Nitride (TaN); Titanium (Ti); Titanium Nitride (TiN); Tungsten Nitride (WN); Tungsten (W); Hafnium Oxide (HfO); Cobalt (Co); Cobalt Silicide (CoS); Zirconium dioxide ($ZrO_2$); and other suitable materials. Also, combinations of the above materials may be used, or combinations of one or more of these materials and other materials may be used. Overlying the etch stop layer is a stem polysilicon layer 328 (from which the stem portions of floating gates are later formed). In other examples, floating gate material may be a material other than doped polysilicon. For example, a metal may be used as a floating gate material. In one example, where the pitch is approximately 44-56 nanometers (i.e. pattern repeats every 44-56 nanometers), the base polysilicon layer 324 has a thickness of 10-20 nanometers, the etch stop layer has a thickness of 5-30 Angstroms (e.g. 20 Angstroms), and the stem polysilicon layer has a thickness of 40-120 nanometers. These layers may be deposited as successive blanket layers that cover an entire wafer.

Overlying the stem polysilicon layer 328 is a pattern that includes Silicon Nitride strips 330a-b (extending in the direction perpendicular to the cross-section shown, i.e. extending in the bit line direction) and sidewall spacers 332a-c formed along the sides of the Silicon Nitride strips 330a-b. Silicon Nitride strips 330a-b may be formed by conventional patterning using photolithography. In addition, techniques such as resist slimming may be used to obtain strips that have one or more dimensions that are smaller than the minimum feature size achievable by lithography alone. The sidewall spacers 332a-c are formed of a suitable material (e.g. polysilicon) by depositing a blanket layer and etching back to leave just sidewall spacers 332a-c. The purpose of the Silicon Nitride strips 330a-b is to define the locations for the sidewall spacers 332a-c, and only the sidewall spacers 332a-c are needed for subsequent patterning. So Silicon Nitride strips 330a-b are removed, using a selective etch that leaves sidewall spacers intact, at this point. Sidewall spacers 332a-c can be formed to have a dimension that is less than the minimum feature size achievable from the lithography process used to form Silicon Nitride strips 330a-b. For example, in FIG. 3, Silicon Nitride strips 330a-b have a dimension F (the minimum feature size achievable with the particular lithography system used), while the sidewall spacers 332a-c have a dimension that is less than F.

Figure 4:
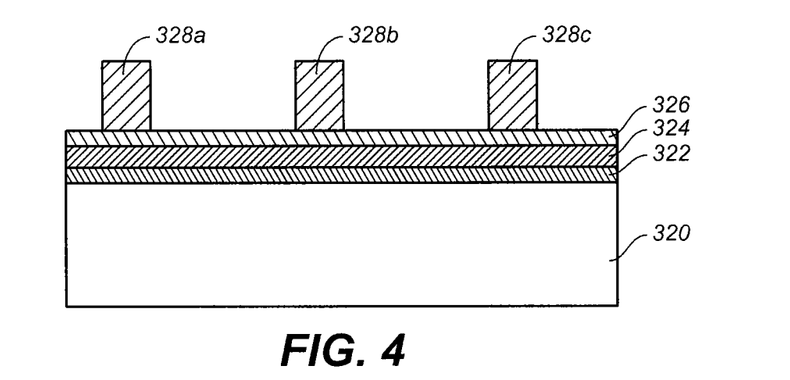
FIG. 4 shows the same view as FIG. 3 after etching the stem polysilicon layer down to the etch stop layer.

Using the sidewall spacers 332a-c as a mask layer, an etch step is performed. The etch is anisotropic, e.g. using Reactive Ion Etching (RIE). This etch step stops at the etch stop layer 326. Thus, the stem polysilicon layer 328 is patterned according to the sidewall spacers 332a-c in this step, but lower layers, including the base polysilicon layer 324, are not patterned by these steps and remain intact. The result, shown in FIG. 4, is that strips of stem polysilicon 328a-c extend in the bit line direction, while lower layers remain as blanket layers.

Figure 5:
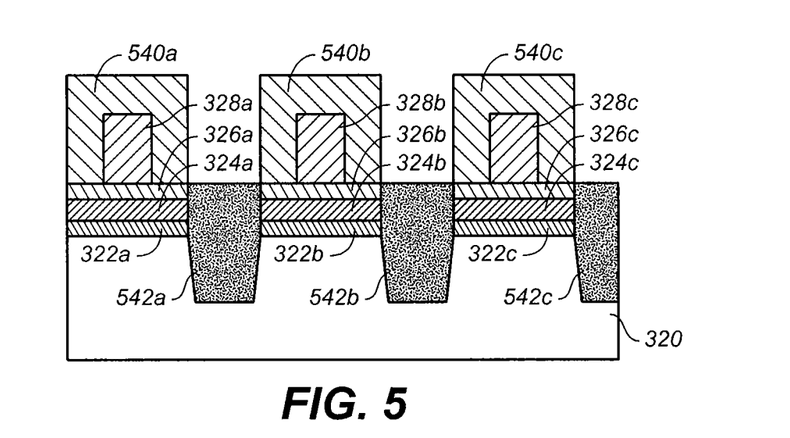
FIG. 5 shows the same view as FIG. 4 after formation of Silicon Nitride spacers on stem polysilicon portions, and formation of STI regions using the spacers as a mask.

Subsequently, Silicon Nitride portions 540a-c are grown on the surfaces of the stem polysilicon portions 328a-c and the stem polysilicon portions 328a-c with the Silicon Nitride portions 540a-c are used as a mask to etch trenches through the etch stop layer 326, base polysilicon layer 324, gate dielectric layer 322 and into the substrate 320 to form STI trenches. The STI trenches are then filled with Silicon dioxide or similar dielectric material to form the STI regions 542a-c that isolate NAND strings. The resulting structure is shown in FIG. 5, with STI regions 542a-c extending into the substrate. During this etch step, the base polysilicon layer 324 is separated into a series of strips 324a-c extending in the bit line direction. Also, gate dielectric layer 322 is separated into strips 322a-c, which extend in the bit line direction, and etch stop layer 326 is separated into strips 326a-c, which extend in the bit line direction.

Figure 6:
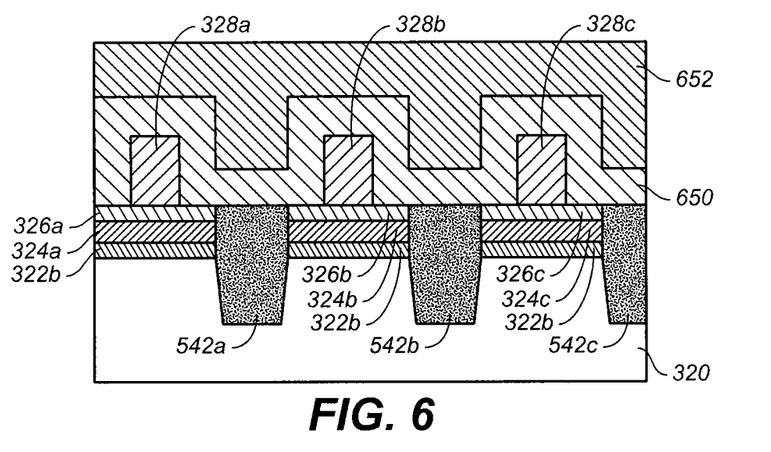
FIG. 6 shows the same view as FIG. 5 after deposition of an IPD layer and a word line polysilicon layer.

Subsequently, the Silicon Nitride portions 540a-c are removed from the stem polysilicon portions 328a-c to expose surfaces of the stem polysilicon portions 328a-c. Then, an Interlayer Dielectric (ILD) 650 is deposited over the substrate 320 including the stem polysilicon portions 328a-c as shown in FIG. 6. The ILD 650 may be a single layer of dielectric, or may be a compound layer made up of different dielectrics, e.g. an Oxide-Nitride-Oxide (ONO) layer. A word line polysilicon layer 652 is deposited over ILD 650. The word line polysilicon layer 652 extends between stem polysilicon portions 328a-c as shown in FIG. 6. The word line polysilicon layer 652 may be planarized at this point to facilitate subsequent processing. The result shown in FIG. 6 is a pattern of STI regions 542a-c and polysilicon strips extending in the bit line direction. The base polysilicon strips 324a-c and stem polysilicon strips 328a-c form inverted-T shapes in the cross section shown. The next steps deal with patterning these strips to form separate floating gates.

Figure 7:
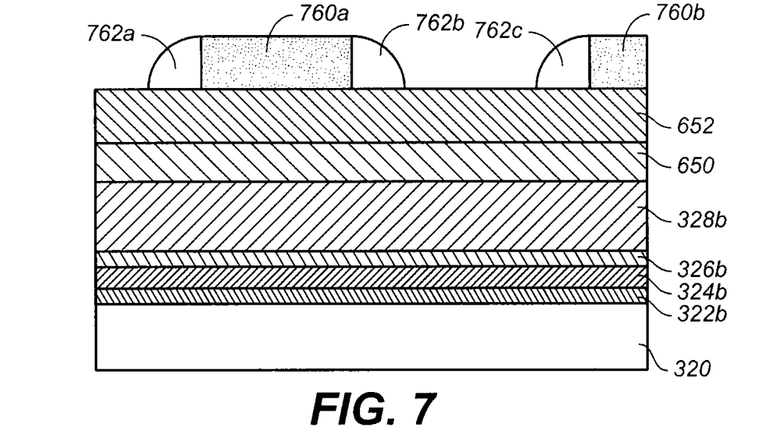
FIG. 7 shows the structure of FIG. 6 along the bit line direction, after Silicon Nitride strips and sidewall spacers are formed over the word line polysilicon.

FIG. 7 shows the structure of FIG. 6 in cross section along the bit line direction (along II-II), with additional Silicon Nitride strips 760a-b and sidewall spacers 762a-c formed over the word line polysilicon layer 652. The Silicon Nitride strips 760a-b and sidewall spacers 762a-c may be formed as before. Silicon Nitride strips 760a-b are then removed leaving only sidewall spacers 762a-c (formed of polysilicon in this example). An etch step is then performed using the sidewall spacers 762a-c as a mask layer.

Figure 8:
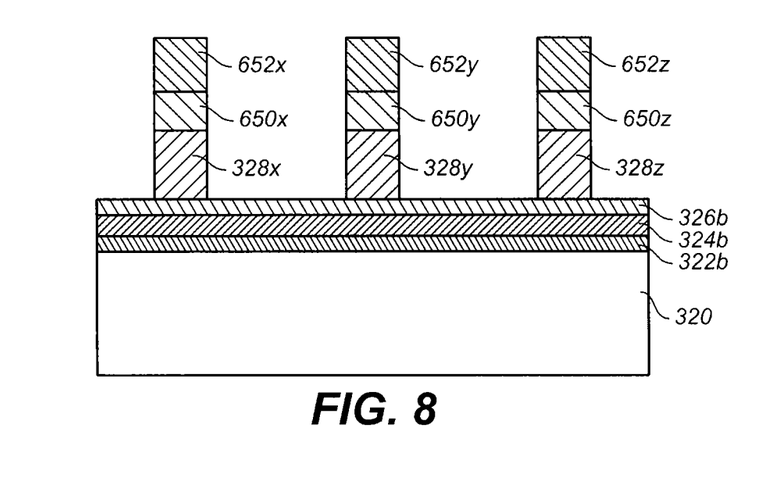
FIG. 8 shows the same view of FIG. 7 after removal of the Silicon Nitride strips and etching down to the etch stop layer using sidewall spacers as an etch mask.

FIG. 8 shows the result of the etch step, with the word line polysilicon 652, ILD 650, and stem polysilicon portions 328b all etched in the pattern of sidewall spacers 762a-c. Thus, word line polysilicon layer 652 is separated into word lines 652x-z. Also, ILD layer 650 is separated into ILD portions 650x-z and stem polysilicon portion 328 is further separated into separate stems (stem portions) 328x-z. The etch step stops at the etch stop layer portion 326b. Sidewall spacers 762a-c are removed by this etch step. Thus, both this etch and the previous etch of the stem polysilicon layer 328 stop at the etch stop layer 326. By etching both the word line polysilicon 652 and the stem polysilicon portion 328b in this etch step, word lines 652x-z and stems 328x-z of floating gates are formed in a self-aligned manner. This improves uniformity of coupling between word lines and floating gates as compared with processes that require alignment of such features.

Figure 9:
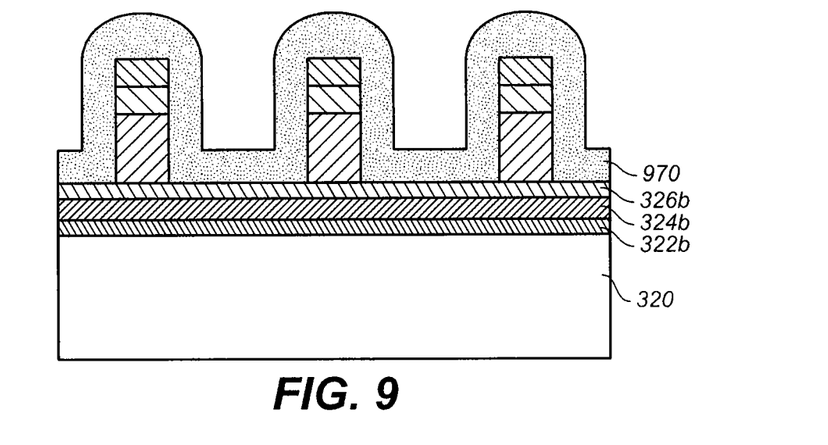
FIG. 9 shows the same view as FIG. 8 after deposition of a Silicon Nitride layer.
Figure 10:
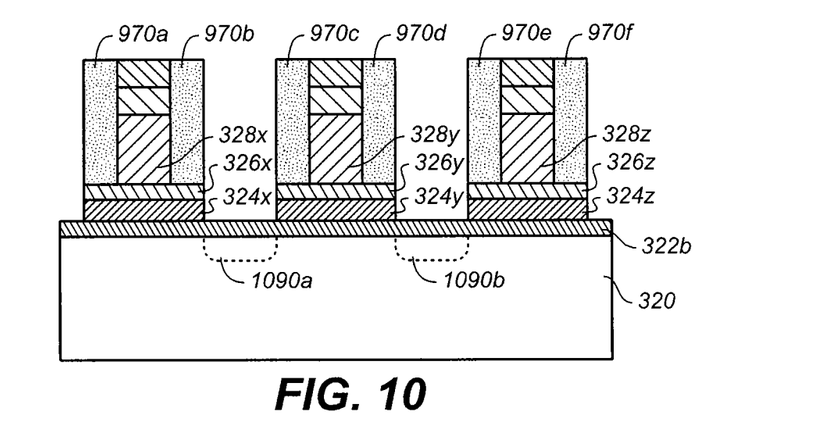
FIG. 10 shows the same view as FIG. 9 after etch back of the Silicon Nitride layer to form sidewall spacers, and subsequent etching of the base polysilicon layer using the sidewall spacers as an etch mask.

Subsequently, a Silicon Nitride layer 970 is deposited over the substrate 320 as shown in FIG. 9. Silicon Nitride layer 970 is then etched back using anisotropic etching, so that Silicon Nitride portions 970a-f remain on sides of stem polysilicon portions 328x-z, but are removed from the etch stop layer portion 326b between stem portions 328x-z. A further etch step is then performed that goes through the etch stop layer portion 326b, separating it into portions 326x-z, and through base polysilicon portion 324b, separating it into portions 324x-z. This etch step separates floating gates as shown in FIG. 10. Thus, at this point, separate floating gates (e.g. floating gate 117 made up of base portion 324y, etch stop layer portion 326y, and stem portion 328y) are formed that have an inverted-T shape along the bit line direction (as shown in FIG. 10) and along the word line direction (as shown previously). Source/drain implantation may be performed at this point, forming conductive source/drain regions 1090a-b in the substrate 320 between floating gates and thereby connecting channels of memory cells along the NAND string.

Figure 11:
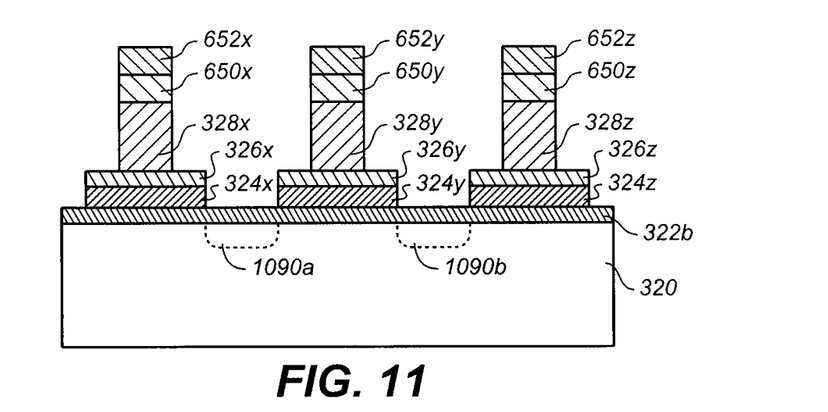
FIG. 11 shows the same view as FIG. 10 after removal of the Silicon Nitride sidewall spacers.

The remaining Silicon Nitride portions 970a-f are then removed from sides of stem portions 328x-z, to expose the polysilicon as shown in FIG. 11. The base portion and stem portion of a floating gate are separated by an etch stop layer portion as shown (e.g. base portion 324y and stem portion 328y are separated by etch stop layer portion 326y). Thus, for a base and stem to act as a single floating gate, there must be some electrical connection between the base and stem, through the etch stop layer portion. In one example, the material of the etch stop layer is a highly electrically conductive material (similar to doped polysilicon of the base and stem) so that electrical current can freely flow between base and stem.

Even if the etch stop material is only a poor conductor, because the etch stop layer is very thin, it may not provide a large resistance to current flow between base and stem and may still be usable in this location.

Figure 12:
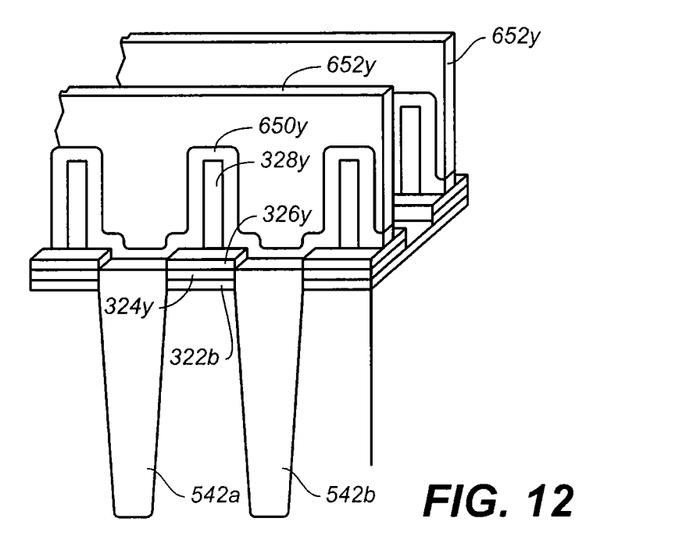
FIG. 12 shows the structure of FIG. 11 in three dimensions.

A three-dimensional view of the structure of FIG. 11 is shown in FIG. 12. In particular, FIG. 12 shows how floating gates form an inverted-T shape in both the word line and bit line direction. FIG. 12 also shows how floating gate stems are self-aligned with word lines, e.g. stem 328y and word line 652y, because these elements are formed by the same etch step, i.e. the same etch step that forms separate word lines also defines floating gate stems in the bit line direction. While both the bases and stems of floating gates in FIG. 12 are formed of electrically conductive doped polysilicon, other conductive materials, including metals, may also be used. In one example, stem portions are formed of one or more metals, while bases are formed of doped polysilicon. In this way, metal is not in close proximity to the channel region, where metal contamination could adversely affect device characteristics.

Figure 13:
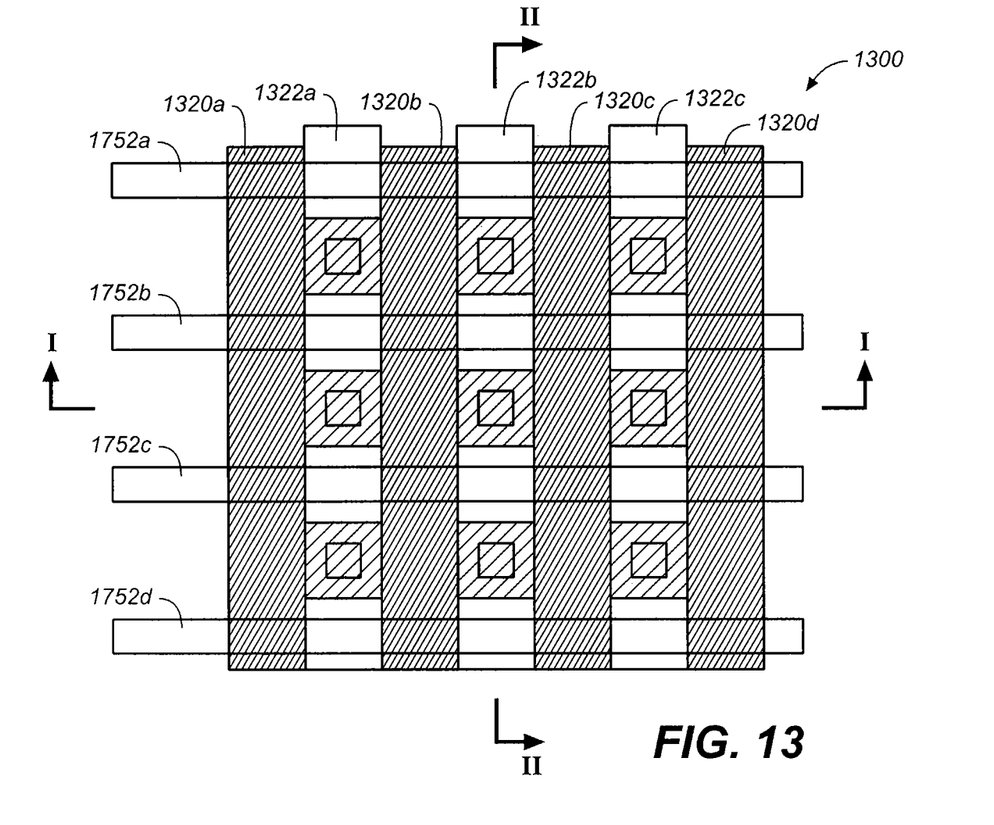
FIG. 13 shows a NAND flash memory array according to another embodiment of the present invention, where word lines extend between floating gates.

An alternative NAND memory array 1300 is shown in plan view in FIG. 13. In this type of NAND memory, word lines 1752a-d extend between floating gates instead of extending over them as before. Thus, an individual floating gate is coupled to two word lines in this arrangement, instead of coupling to just one word line as in the prior example. Examples of memory arrays of this kind are described in U.S. Pat. No. 6,888,755. The floating gates of the NAND memory array of FIG. 13 are similar to the floating gate shown in FIG. 2. That is to say, they have an inverted-T shape in cross section in both the bit line and word line directions. STI regions 1320a-d extend between NAND strings 1322a-c as before.

An exemplary process for forming the NAND array of FIG. 13 is described below. When forming this type of NAND memory array, STI formation may be performed prior to control gate formation or after control gates are formed. If STI regions are formed after control gates have already been formed, then the patterning for STI formation separates control gates along a row and they must be rejoined to form a word line. Otherwise the process flows are similar, and differences between these alternative process flows are not significant for the following process.

Figure 14:
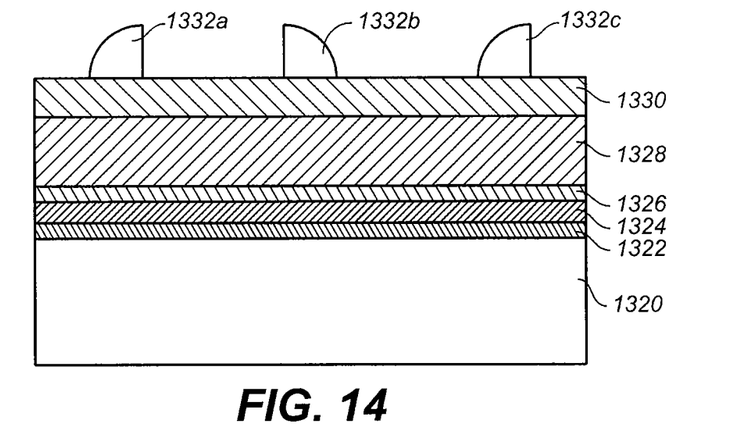
FIG. 14 shows the NAND flash memory of FIG. 13 at an intermediate stage of fabrication, in cross section along the bit line direction, with a gate dielectric layer, base polysilicon layer, etch stop layer, stem polysilicon layer and HTO layer and sidewall spacers.

FIG. 14 shows the NAND memory array 1300 of FIG. 13 at an intermediate stage of fabrication in cross section along the bit line direction (i.e. along II-II of FIG. 13). FIG. 14 shows a substrate 1320 with a gate dielectric layer 1322, base polysilicon layer 1324, etch stop layer 1326, and stem polysilicon layer 1328 that are similar to corresponding layers in the previous example. However, in addition to these layers, a High Temperature Oxide (HTO) layer 1330 overlies the stem polysilicon layer 1328 in this example. Sidewall spacers 1332a-c are shown on the HTO layer 1330. The sidewall spacers 1332a-c may be formed as before, using polysilicon deposition over Silicon Nitride strips that are subsequently removed. In the present example, STI regions are formed prior to this stage and are already in place, extending parallel to the cross section shown, out of sight in this view. The process up to this point may be performed in a similar manner to the process shown in FIGS. 3-5, and the structure of FIG. 14 is similar to that of FIG. 5 in cross section along I-I.

Figure 15:
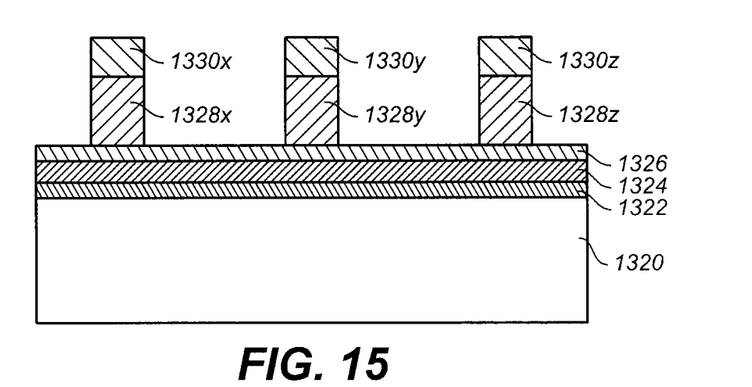
FIG. 15 shows the same view as FIG. 14 after etching down through the stem polysilicon layer to the etch stop layer, using the sidewall spacers as a mask.

Subsequent to removing the Silicon Nitride strips to obtain the structure shown in FIG. 14, the sidewall spacers 1332a-c are used as a mask to etch down through the HTO layer 1330 forming separate HTO strips 1336x-z and through stem polysilicon 1328 forming stem portions 1328x-z, then stopping at the etch stop layer 1326. The results of this etch step are shown in FIG. 15, which also shows that sidewall spacers 1332a-c have been removed by the etch step.

Figure 16:
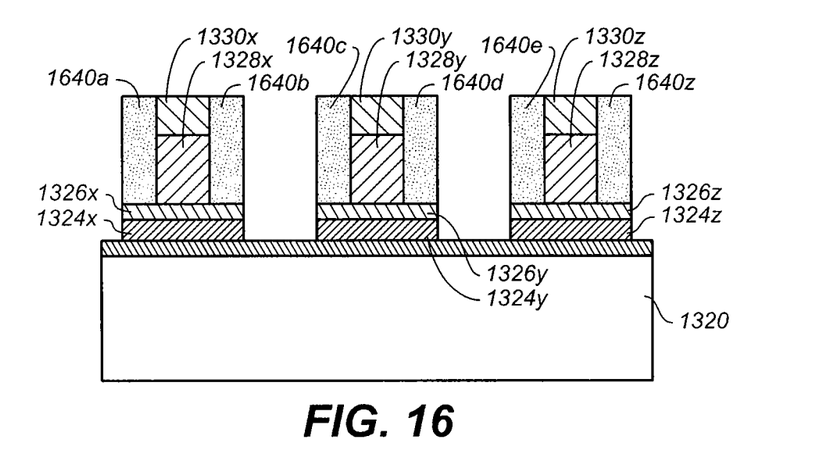
FIG. 16 shows the same view as FIG. 15 after formation of Silicon Nitride spacers on the sides of stem polysilicon portions.

Subsequently, Silicon Nitride spacers 1640a-f are formed on sides of stem polysilicon portions 1328x-z by depositing a blanket layer of Silicon Nitride and anisotropically etching to leave only Silicon Nitride spacers 1640a-f on sidewalls of stem polysilicon portions 1328x-z. Then, Silicon Nitride spacers 1640a-f are used as a mask during an etch step to separate floating gates as shown in FIG. 16. In particular, etch stop layer 1326 is divided into separate portions 1326x-z in this step, and base polysilicon 1324 is separated into portions 1324x-z. Silicon Nitride sidewall spacers 1640a-f are removed at this point to expose surfaces of stem polysilicon portions 1328x-z.

Figure 17:
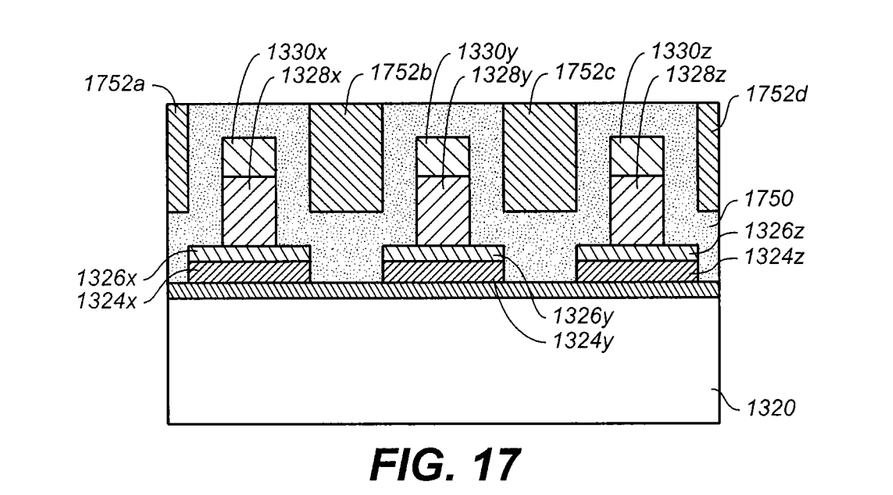
FIG. 17 shows the same view as FIG. 16 after deposition of an IPD layer and a word line polysilicon layer, and subsequent planarization of the word line polysilicon layer to leave word lines extending between floating gates.

Next, an IPD layer 1750 is deposited to cover the floating gates. Then, a word line polysilicon layer is deposited and planarized (etched back or planarized by CMP) to leave word lines 1752a-d extending between floating gates as shown in FIG. 17. Word lines 1752a-d form control gates where they couple to floating gates. In a process where STI regions were not formed earlier, they may be formed at this point, in which case, additional steps are needed to reconnect control gates along a row.

Figure 18:
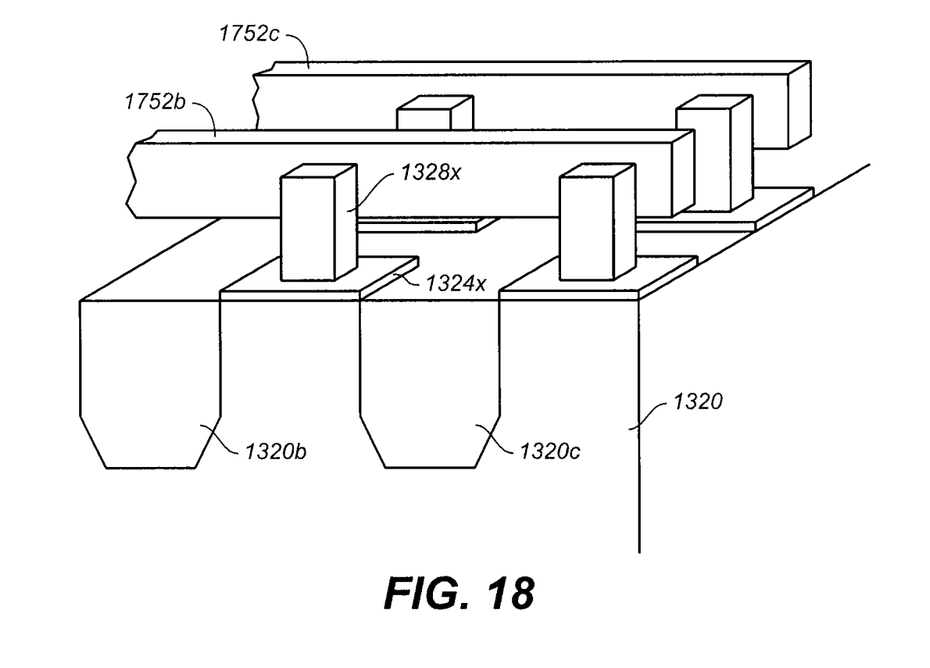
FIG. 18 shows the structure of FIG. 17 in three dimensions including word lines extending between floating gates, the floating gates having an inverted-T shape in cross section along both the word line direction and the bit line direction.

FIG. 18 shows the structure of FIG. 17 in three dimensions, with word lines 1752b-c extending between floating gates, and with floating gates having an inverted-T shape in both the word line and the bit line direction. As in the previous example, the same etch stop layer is used to form the inverted-T shape in both the bit line and the word line directions in this example.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

What is claimed is:

1. A method of forming a floating gate memory array comprising;
    forming a gate dielectric layer over a substrate surface;
    forming a first conductive floating gate layer directly over the gate dielectric layer;
    forming an etch stop layer over the first conductive floating gate layer;
    forming a second conductive floating gate layer over the etch stop layer;
    forming upper portions of a plurality of floating gates by etching down through the second conductive floating gate layer, to the etch stop layer, according to a first pattern, as a plurality of narrow stems with reduced dimensions in both a bit line direction of the memory array and a word line direction of the memory array, the bit line direction being perpendicular to the word line direction, the forming the upper portions of the plurality of floating gates comprises a first etch step that separates the upper portions in the bit line direction by etching the second conductive floating gate layer down to the etch stop layer such that the first conductive floating gate layer is not patterned during the first etch step, and a second etch step that separates the upper portions in the word line direction by etching the second conductive floating gate layer down to the etch stop layer such that the first conductive floating gate layer is not patterned during the second etch step;

subsequently forming lower portions of the plurality of floating gates by etching down through the first conductive floating gate layer, to the gate dielectric layer, using a second pattern, as a plurality of bases having larger dimensions than the narrow stems in both the bit line direction and the word line direction, thereby forming a plurality of separate floating gates having an inverted-T shape, the plurality of separate floating gates extend in a plurality of columns of the memory array in the bit line direction and in a plurality of rows of the memory array in the word line direction;

depositing an additional dielectric layer which covers the plurality of separate floating gates;

depositing a word line polysilicon layer over the additional dielectric layer; and planarizing the word line polysilicon layer, leaving a plurality of word lines extending in the word line direction, each word line of the plurality of word lines extends between two adjacent rows of the plurality of rows of separate floating gates, wherein each word line extends directly between two adjacent rows of the narrow stems in the word line direction, but not between two adjacent rows of the bases in the word line direction.

2. The method of claim 1 wherein the etch stop layer comprises an electrically conductive material.

3. The method of claim 1 wherein the etch stop layer comprises one or more of: Silicon Nitride (SiN); Silicon dioxide (SiO.sub.2); Alumina (Al.sub.2O.sub.3); Tantalum (Ta); Tantalum Nitride (TaN); Titanium (Ti); Titanium Nitride (TiN); Tungsten Nitride (WN); Tungsten (W); Hafnium Oxide (HfO); Cobalt (Co); Cobalt Silicide (CoS); or Zirconium dioxide (ZrO.sub.2).

4. The method of claim 1, wherein:
each of the plurality of word lines extends across the memory array.

5. The method of claim 1, wherein:
each of the columns of separate floating gates is in a respective NAND string, each NAND string extends in the bit line direction of the memory array.

6. A method of forming a floating gate memory array, comprising:
forming a gate dielectric layer on a substrate;
forming a first conductive floating gate layer that directly overlies the gate dielectric layer;
forming an etch stop layer that overlies the first conductive floating gate layer;
forming a second conductive floating gate layer that overlies the etch stop layer;
etching the second conductive floating gate layer down to the etch stop layer, leaving second conductive floating gate portions with a first dimension along a word line direction of the memory array;
etching the first conductive floating gate layer down to the gate dielectric layer leaving first conductive floating gate portions with a second dimension along the word line direction, the second dimension being greater than the first dimension along the word line direction;
etching the second conductive floating gate portions down to the etch stop layer, leaving stems with a third dimension along a bit line direction of the memory array;
etching the first conductive floating gate portions down to the gate dielectric to leave bases with a fourth dimension along the bit line direction, the fourth dimension being greater than the third dimension along the bit line direction; and
forming a plurality of word lines extending in the word line direction, the plurality of word lines do not extend over floating gates of the floating gate memory array, and each word line of the plurality of word lines extends directly between two adjacent rows of the stems in the word line direction, but not between two adjacent rows of the bases in the word line direction, each floating gate of the floating gate memory array is formed as an inverted-T shape in both the bit line direction and the word line direction, the bit line direction being perpendicular to the word line direction.

7. The method of claim 6 wherein the etch stop layer comprises an electrically conductive material.

8. The method of claim 6 wherein the etch stop layer comprises one or more of: Silicon Nitride (SiN); Silicon dioxide (SiO.sub.2); Alumina (Al.sub.2O.sub.3); Tantalum (Ta); Tantalum Nitride (TaN); Titanium (Ti); Titanium Nitride (TiN); Tungsten Nitride (WN); Tungsten (W); Hafnium Oxide (HfO); Cobalt (Co); Cobalt Silicide (CoS); or Zirconium dioxide (ZrO.sub.2).

9. The method of claim 6 wherein each word line is configured to couple to the floating gates of the two adjacent rows between which the word line extends.

* * * * *